(12) United States Patent
Perlov et al.

(10) Patent No.: US 6,283,692 B1
(45) Date of Patent: Sep. 4, 2001

(54) APPARATUS FOR STORING AND MOVING A CASSETTE

(75) Inventors: Ilya Perlov; Evgueni Gantvarg, both of Santa Clara; Victor Belitsky, Sunnyvale, all of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/201,737

(22) Filed: Dec. 1, 1998

(51) Int. Cl.[7] .................................................. B65G 49/07
(52) U.S. Cl. ................. 414/222.01; 414/217.1; 414/222.13; 414/940
(58) Field of Search ........................ 414/217.1, 222.01, 414/222.13, 226.03, 940, 281

(56) References Cited

U.S. PATENT DOCUMENTS

| | | | |
|---|---|---|---|
| 4,775,281 | 10/1988 | Prentakis | 414/416 |
| 4,951,601 | 8/1990 | Maydan et al. | 118/719 |
| 4,986,715 | 1/1991 | Asakawa | 414/331 |
| 5,363,867 | * 11/1994 | Kawano et al. | 414/940 X |
| 5,372,241 | * 12/1994 | Matsumoto | 414/222.13 X |
| 5,387,265 | 2/1995 | Kakizaki et al. | 29/25.01 |
| 5,388,945 | * 2/1995 | Garric et al. | 414/217.1 |
| 5,464,313 | * 11/1995 | Ohsawa | 414/940 X |
| 5,466,109 | * 11/1995 | Iizuka | 414/940 X |
| 5,562,383 | * 10/1996 | Iwai et al. | 414/217.1 |
| 5,628,604 | 5/1997 | Murata et al. | 414/940 |
| 5,955,857 | * 9/1999 | Kwon et al. | 414/281 |
| 5,957,648 | * 9/1999 | Bachrach | 414/940 X |
| 5,964,561 | * 10/1999 | Marohl | 414/222.13 X |
| 5,980,183 | 11/1999 | Fosnight | 414/222.01 |
| 6,079,927 | * 6/2000 | Muka | 414/940 X |
| 6,129,496 | * 10/2000 | Iwasaki et al. | 414/940 |
| 6,183,186 | * 2/2001 | Howells et al. | 414/222.01 |

FOREIGN PATENT DOCUMENTS

| | | |
|---|---|---|
| 0 552 756 A1 | 7/1993 | (EP). |
| 1067932 | * 3/1989 | (JP) ..... 414/940 |
| 3244121 | * 10/1991 | (JP) ..... 414/940 |
| 4158508 | * 6/1992 | (JP) ..... 414/940 |
| WO 98 46503 | 10/1998 | (WO). |
| WO 99 02436 | 1/1999 | (WO). |

* cited by examiner

*Primary Examiner*—James W. Keenan
(74) *Attorney, Agent, or Firm*—Dugan & Dugan LLP

(57) ABSTRACT

A cassette stocker includes a plurality of cassette storage shelves positioned adjacent a cleanroom wall above a cassette docking station, and a cassette mover to carry a cassette between the shelves and the docking station. An interstation transfer apparatus includes an overhead support beam and a transfer arm adapted to carry a cassette between processing stations.

10 Claims, 11 Drawing Sheets

APPARATUS FOR STORING AND MOVING A CASSETTE

BACKGROUND OF THE INVENTION

1. Field of the Invention

The present invention relates generally to substrate processing, and more particularly to an apparatus for storing and moving substrate cassettes.

2. Background of the Related Art

Semiconductor devices are made on substrates, such as silicon wafers or glass plates, for use in computers, monitors, and the like. These devices are made by a sequence of fabrication steps, such as thin film deposition, oxidation or nitration, etching, polishing, and thermal and lithographic processing. Although multiple fabrication steps may be performed in a single processing station, substrates must be transported between different processing stations for at least some of the fabrication steps.

Substrates are stored in cassettes for transfer between processing stations and other locations. Although cassettes may be carried manually between processing stations, the transfer of cassettes is typically automated. For example, a cassette may be transported to a processing station in an automatic guided vehicle (AGV), and then loaded from the AGV onto a loading platform in the processing station by a robot. Another robot may extract a substrate from the cassette and transport it into a processing chamber at the processing station. When the fabrication steps are complete, the substrate is loaded back into the cassette. Once all of the substrates have been processed and returned to the cassette, the cassette is removed from the loading platform and transported to another location by the AGV.

In order to ensure that the processing equipment does not sit idle, a nearly continuous supply of unprocessed substrates should be available at the processing station. Unfortunately, many processing stations can hold only a single cassette at the loading platform. Therefore, once all of the substrates in the cassette have been processed, the cassette must be quickly replaced, either manually or by an AGV, with a new cassette containing unprocessed substrates. Unfortunately, running such a just-in-time cassette inventory system requires either significant operator oversight or a large number of AGVs, thereby increasing the costs of the fabrication facility.

Therefore, there is a need for a method and apparatus which continuously supplies substrate cassettes to a processing system so that system down time is reduced or eliminated.

SUMMARY OF THE INVENTION

The present invention provides a method and apparatus for storing multiple cassettes at a processing station, ensuring that a nearly continuous supply of unprocessed substrates is available for processing and that the processing equipment does not sit idle. Multiple cassettes can be stored at a processing station in a front end support frame and a cassette can be moved to a docking station where substrates are extracted and transferred to the processing equipment. An automation system is mounted or otherwise disposed on the frame to transfer cassettes between docking stations or between processing stations. The apparatus does not increase the footprint, i.e., the required area on the cleanroom floor, of the processing station. In another aspect of the invention, cassettes can be transported between different processing stations without the use of an AGV.

In one aspect of the invention, an apparatus is provided which includes a front end frame having one or more substrate transfer stations and multiple cassette storage stations. An automated transfer assembly is preferably disposed adjacent the transfer stations and the storage stations to move cassettes between the storage stations and the transfer stations. Additionally, an automated transfer assembly can be located between processing stations to transfer cassettes between processing stations without the need for manual or AGV assistance.

In another aspect of the invention, a method is provided for delivering a continuous supply of cassettes to a processing system. The method preferably includes providing at least one transfer station and multiple storage stations and moving cassettes between the storage stations and the transfer stations to ensure that substrates are continually supplied to the processing system. Additionally, a method is provided for transferring cassettes between processing stations to continue the processing sequence without the need for manual or AGV assistance.

DETAILED DESCRIPTION OF A PREFERRED EMBODIMENT

In the following description, the term "substrate" broadly covers any object that is being processed in a semiconductor device processing system. The term "substrate" includes, for example, semiconductor wafers, flat panel displays, glass plates or disks, and plastic workpieces.

Figure 1:
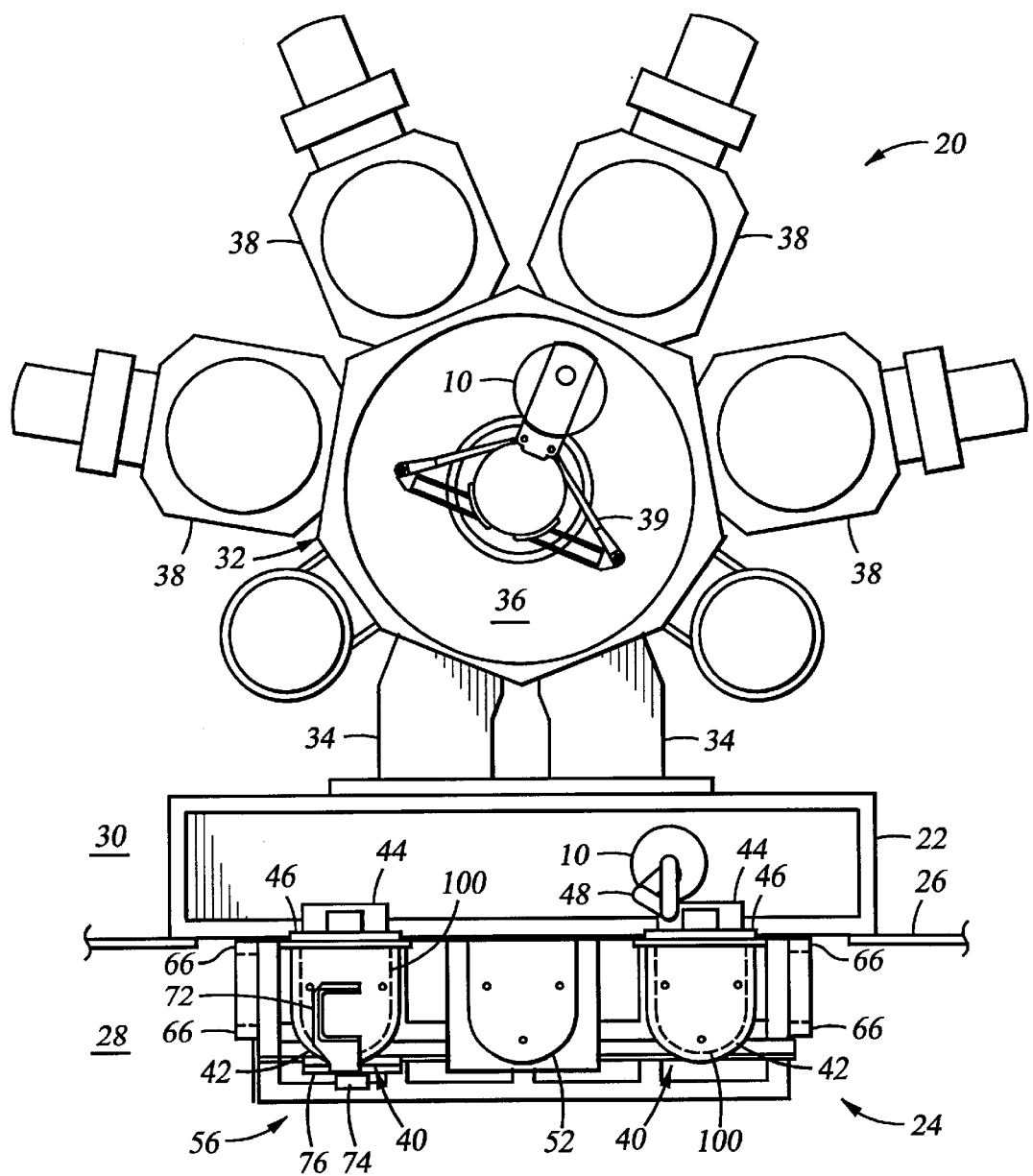
FIG. 1 is a schematic top view of a processing station according to the present invention.

FIG. 1 is a top view of a processing station 20 of the present invention in which one or more substrates 10 are processed. The processing station 20 has a front-end staging area 22 which is separated from a loading and storage area 24 by a cleanroom wall 26. Cleanroom wall 26 separates a cleanroom 28, where loading and storage area 24 is located, from a gray area 30, where a processing system 32 is housed. The loading and storage area 24 is where cassettes of substrates are delivered and loaded/unloaded into/from the processing station 20. Processing system 32 may include one or more load lock chambers 34, a central transfer chamber 36, and a plurality of processing chambers 38. Inside processing chambers 38, the substrate may be subjected to a variety of fabrication steps, such as thin film deposition, oxidation, nitration, etching, thermal processing or lithographic processing. For the purposes of the invention, the processing system and staging area illustrated in FIG. 1 are merely representative. The processing system could have just a single processing chamber, or it could be a device, such as a chemical mechanical polisher, that does not include any processing chambers. In addition, the processing system could perform metrology instead of or in addition to the fabrication steps.

Figure 2:
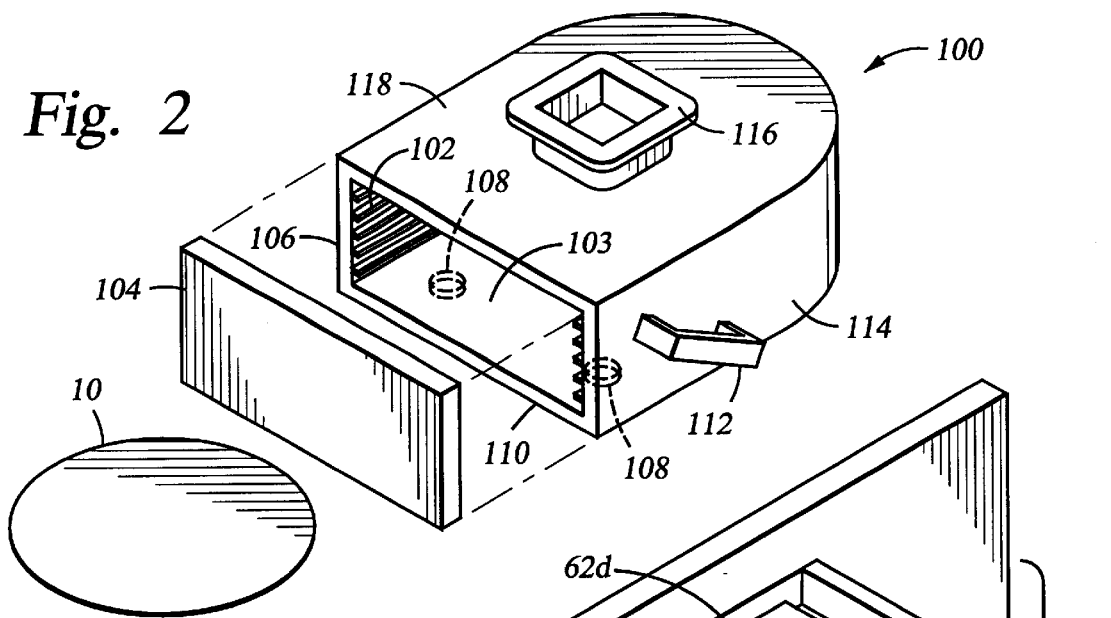
FIG. 2 is a schematic perspective view of a cassette for holding substrates.
Figure 3:
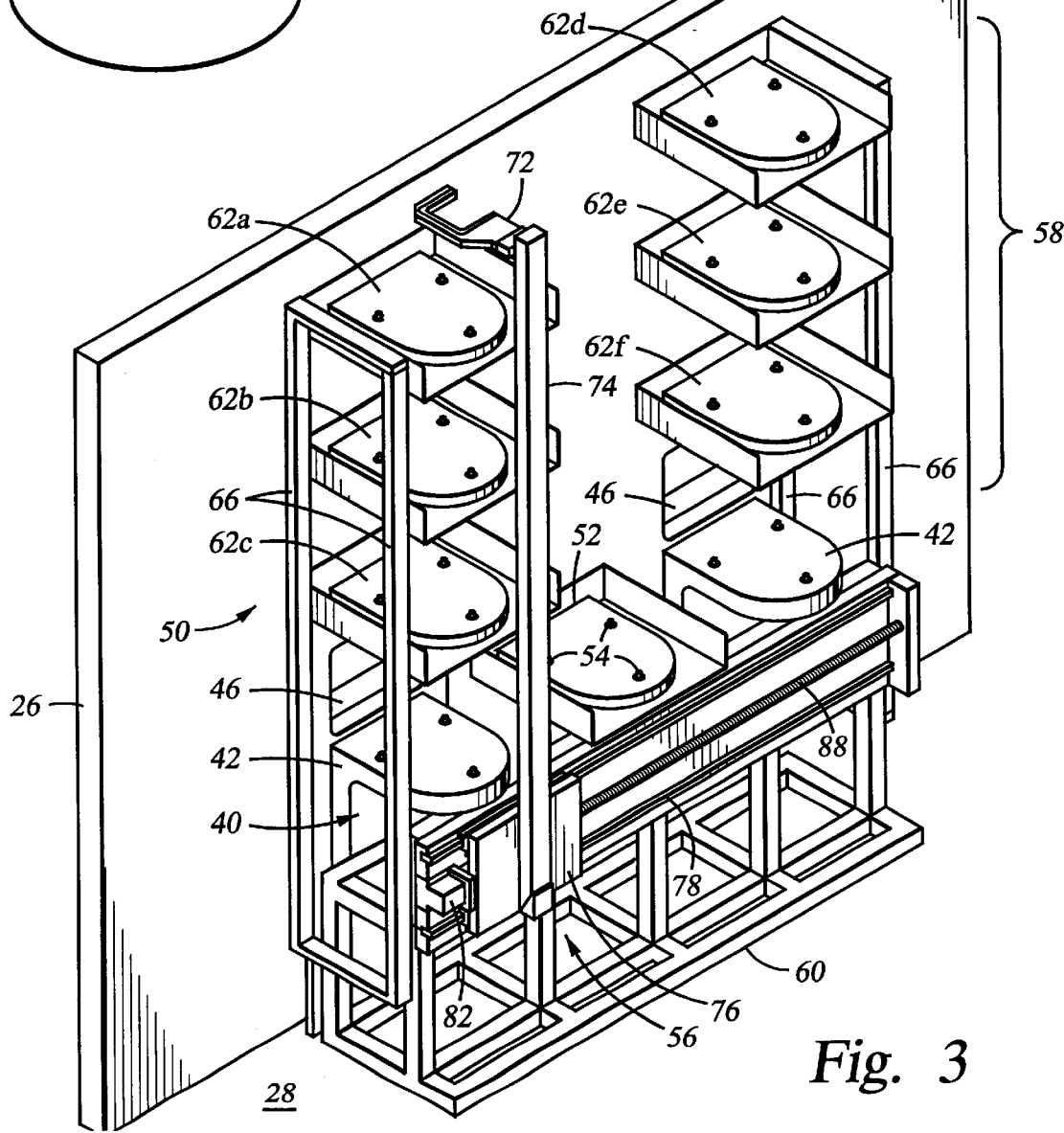
FIG. 3 is a schematic perspective view of a cassette stocker according to the present invention.
Figure 4A:
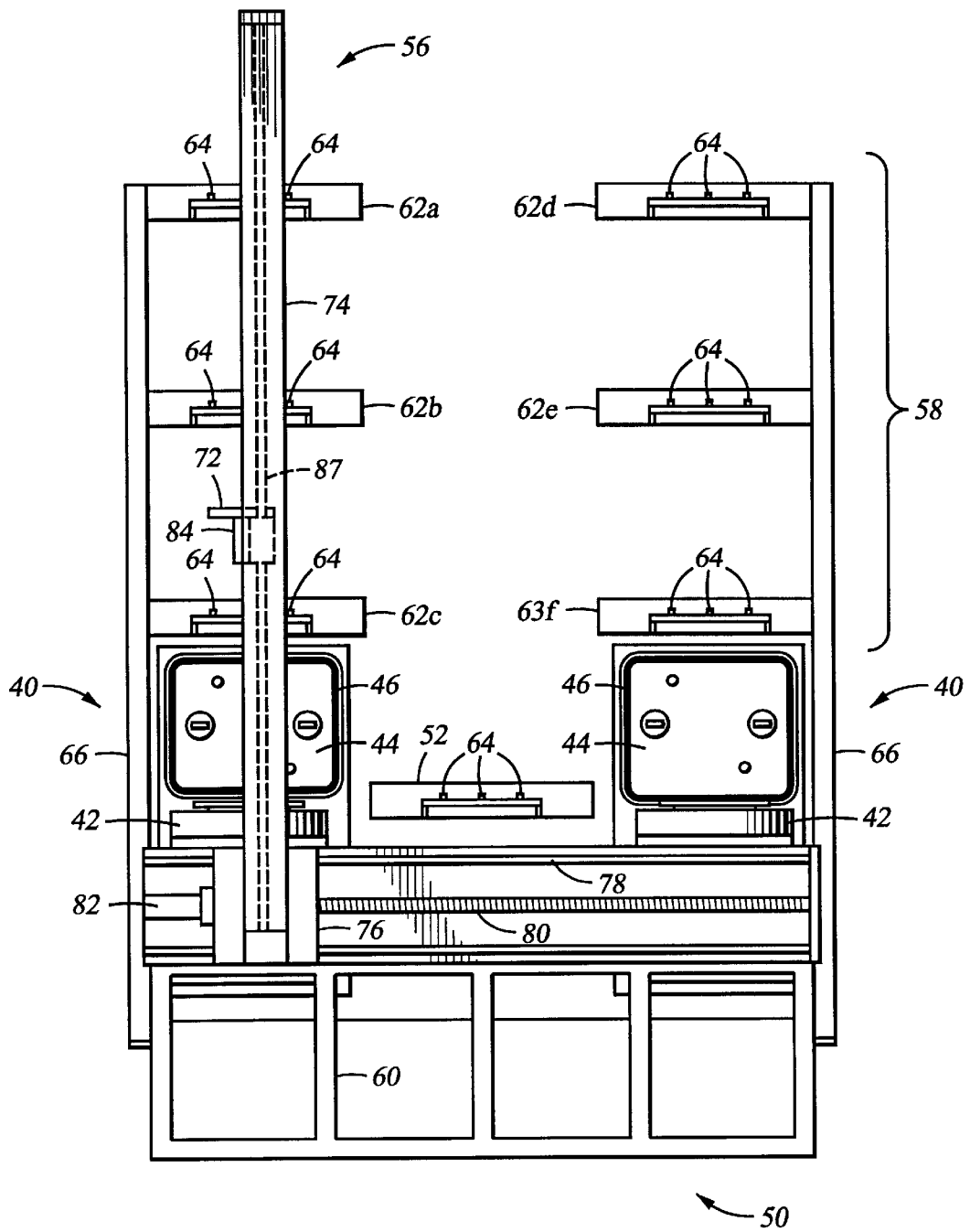
FIG. 4A is a schematic front view of the cassette stocker of FIG. 3.
Figure 4B:
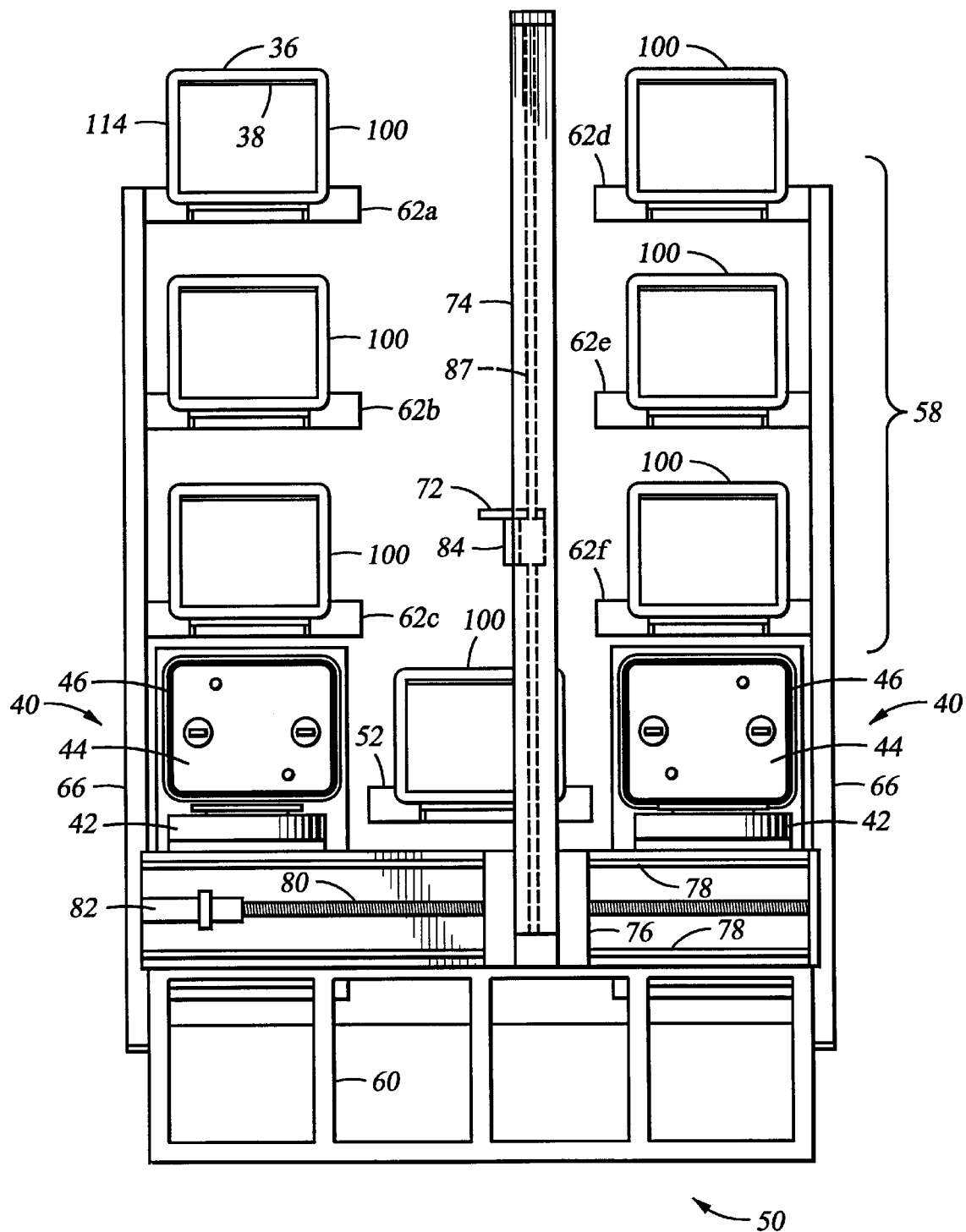
FIG. 4B is a schematic front view of the cassette stocker of FIG. 4A with a plurality of cassettes.
Figure 5A:
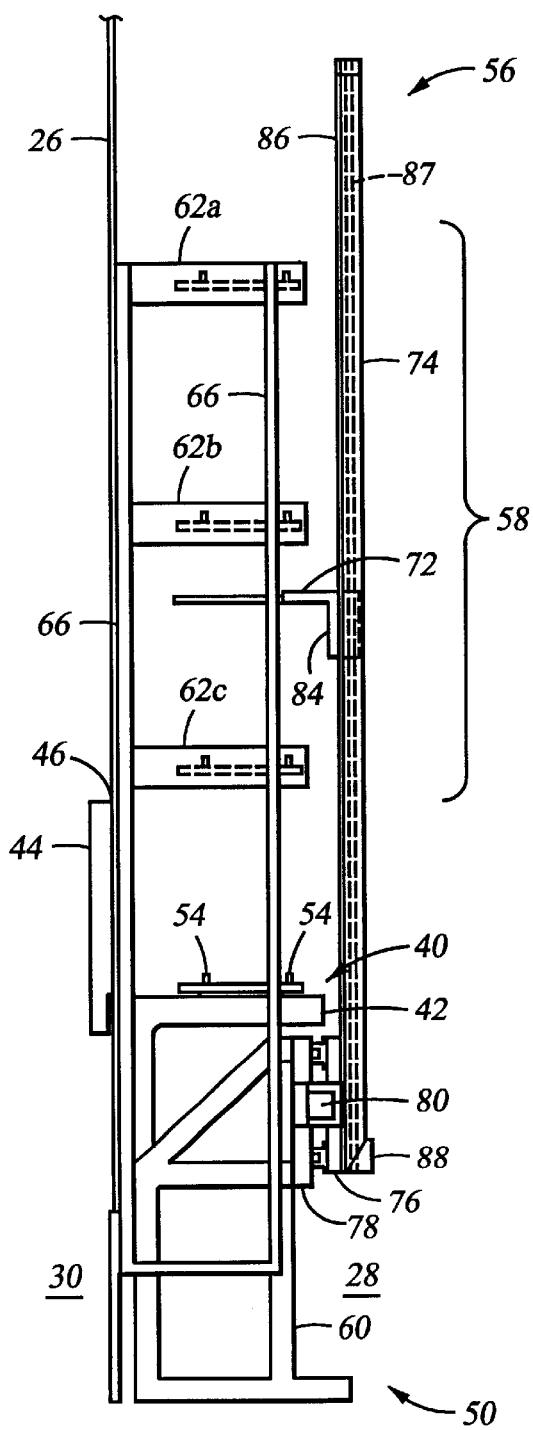
FIG. 5A is a schematic side view of the cassette stocker of FIG. 3.
Figure 5B:
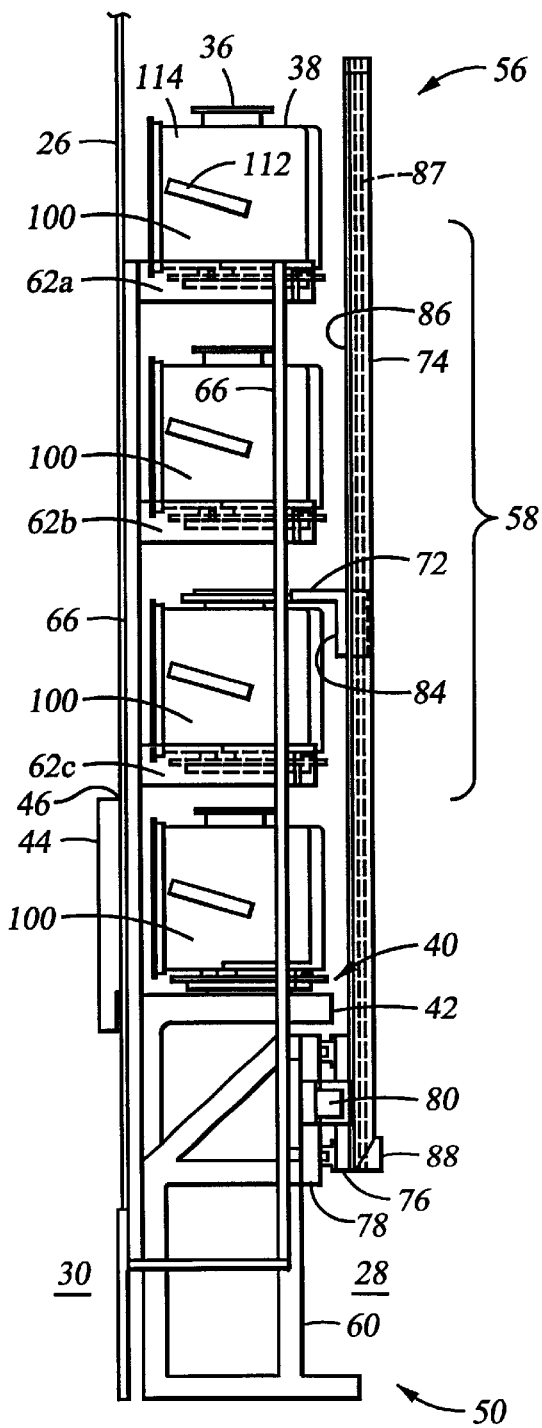
FIG. 5B is a schematic side view of the cassette stocker of FIG. 5A with a plurality of cassettes.

Referring to FIG. 2, one or more substrates 10 are brought to the loading and storage area 24 of the processing station in a cassette 100. Substrates 10 are supported in cassette 100 in a generally parallel horizontal configuration by slot ridges 102. Substrates may be loaded and unloaded from cassette 100 through an entry port 103 located in a generally flat front face 106 of the cassette. A removable cassette door 104 may be secured in entry port 103 to prevent the substrates from being exposed to contaminants when the cassette is moved between processing stations or stored outside a processing station. Each cassette 100 also includes three cylindrical indentations 108 (shown in phantom and only two of which are visible in FIG. 2) formed in an underside 110 of the cassette. When cassette 100 is stored at the processing station, three support pins will fit into indentations 108 to support the cassette. Two handles 112 (only one is shown in this perspective view) which project from sidewalls 114 may be used to manually carry the cassette. A generally rectangular flange 116 having an L-shaped cross-section projects from a top surface 118 of the cassette. As discussed below, a robotic cassette mover at the processing station may manipulate the cassette by means of flange 116.

Referring to FIGS. 1 and 3–5B, loading and storage area 24 of processing station 20 includes a cassette loading platform 52, two cassette docking or substrate transfer stations 40 located on either side of loading platform 52, and a cassette stocker or storage stations 50 (only partially illustrated in FIG. 1 so that docking stations 40 may be seen) for storing cassettes at the processing station and moving the cassettes to and from loading platform 52 and docking stations 40.

A cassette may be placed onto or removed from loading platform 52 either manually or by an AGV. From the loading platform, the cassette may be moved to one of docking stations 40 or into cassette stocker 50. Loading platform 52 has generally the same perimeter shape as a cassette. Three support pins 54 (only two are seen in the side view of FIG. 5A) project vertically from the loading platform to mate with the indentations in the underside of the cassette to support the cassette on the loading platform.

To transfer substrates through the cleanroom wall, cassettes 100 (shown in phantom in FIG. 1) may be positioned at one or both docking stations 40. Each docking station 40 includes a docking platform 42 to support a cassette, an opening 46 formed through cleanroom wall 26, a movable door 44 which seals opening 46 when a substrate is not to be transferred through opening 46 or a cassette is not positioned on docking platform 42, and a mechanism to unlock cassette door 104 and retract the door into front-end staging area 22 to provide horizontal access to the substrate. A description of docking station 40 may be found in U.S. Pat. No. 6,082,951, entitled A WAFER CASSETTE LOAD STATION, by Eric A. Nering, et al., assigned to the assignee of the present invention, the entire disclosure of which is incorporated herein by reference.

Cassette stocker 50 includes a frame 60 that supports one or more storage racks 58 (not illustrated in FIG. 1 so that the docking stations may be shown), and a robotic cassette mover 56 to move the cassettes between the storage rack, the loading platform, and the docking platforms. Frame 60 may be bolted to the floor of cleanroom 28 and/or secured to the cleanroom wall 26. The frame 60 is at least partially disposed below the docking platforms 42 and loading platform 52 so that the footprint of processing station 20 is not increased.

Storage rack 58 may include a vertical column of support shelves above each of the two docking stations 40. Each column may include, for example, one, two, three or more individual support shelves. Thus, storage rack 58 shown in FIGS. 3–5b provides storage space for six cassettes 100 in support shelves 62a–62f (see FIG. 4B). Each support shelf, such as support shelf 62a, may be a horizontally oriented plate having substantially the same perimeter shape as the cassette. Three support pins 64 (only two are shown in the side view of FIG. 5A) project vertically from the support shelf and are positioned to mate with receiving indentations 108 in the underside of the cassette. Two vertical posts 66 may be used to secure the outer edge of each support shelf 62a–62f to frame 60. Additionally, the support shelves could be secured to the cleanroom wall for additional support.

Robotic cassette mover 56 is used to move cassettes between the storage shelves, the loading platform and the docking platforms. The robotic cassette mover includes a vertically movable end effector 72 which is attached to a horizontally movable support strut 74. The support strut 74 permits arbitrary horizontal movement of end effector 72 in a plane parallel to cleanroom wall 26. The bottom of support strut 74 may be secured to a lateral slider 76 which can move horizontally along a horizontal guide 78 that is attached to or formed as part of frame 60. The lateral slider 76 may be driven from side-to-side by a horizontal lead screw 80, which is rotated by a horizontal drive motor 82. The horizontal drive motor 82 may be secured to frame 60. Similarly, end effector 72 may be attached to a vertical slider 84 which can slide vertically along a vertical guide 86 attached to or formed as part of support strut 74. The vertical slider 84 may be driven up and down by a vertical lead screw 87 (shown in phantom in FIGS. 4A–5B) which may be rotated by a vertical drive motor 88. The vertical drive motor may be supported by lateral slider 76. Horizontal drive motor 82 and vertical drive motor 88 may be connected to a control system (not shown), such as a programmable digital computer, to control the vertical and horizontal motion of end effector 72. The actuators which drive the movement of the end effector may include stepper motors, pneumatic actuators and other devices known to impart movement in a controllable manner. In addition, a belt drive assembly or other known mechanism can be utilized to drive the sliders both vertically and horizontally.

Figure 6:
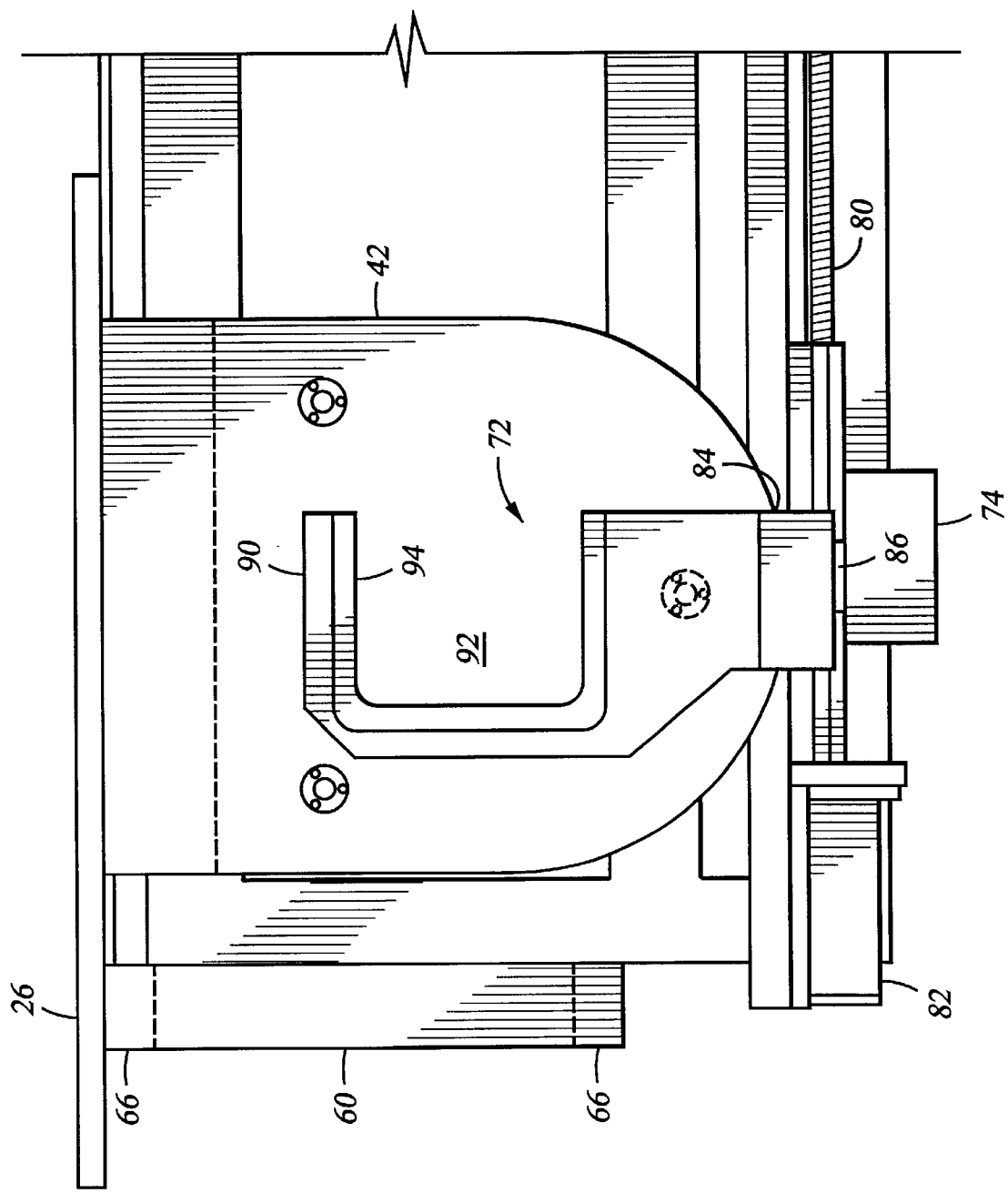
FIG. 6 is a schematic top view of an end effector located over a docking station.

Referring to FIG. 6, end effector 72 projects horizontally from support strut 74 towards cleanroom wall 26. The end effector includes a generally flat, hook-shaped finger 90 that defines a rectangular gap 92 which is open on one side of the end effector. The end effector is adapted to engage a portion of a cassette through the use of the open end of the end effector.

Figure 7A:
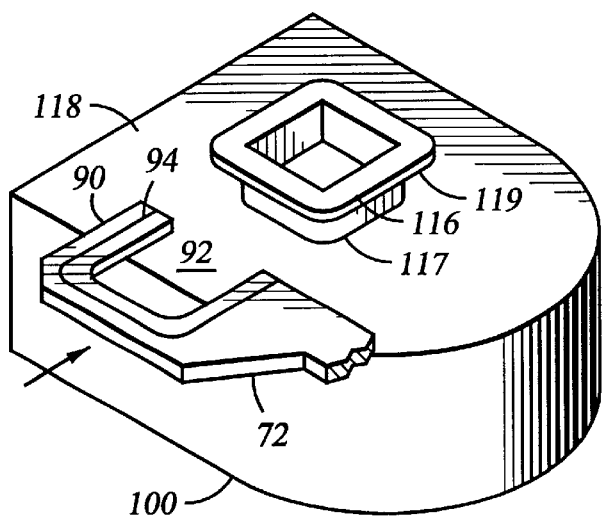
FIGS. 7A, 7B and 7C are schematic perspective views illustrating the end effector lifting and moving a cassette.
Figure 7B:
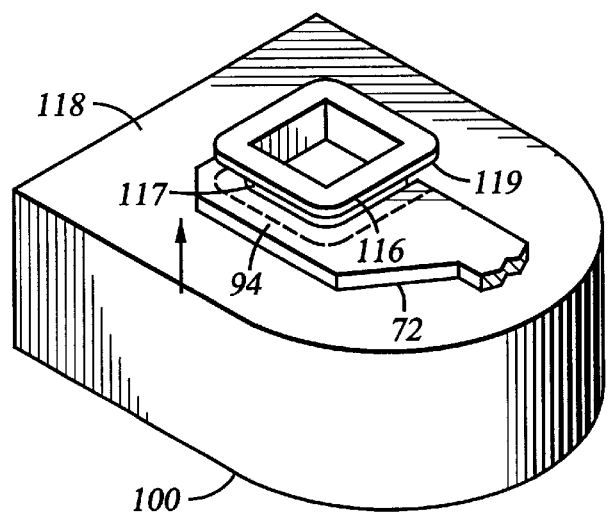
Figure 7C:
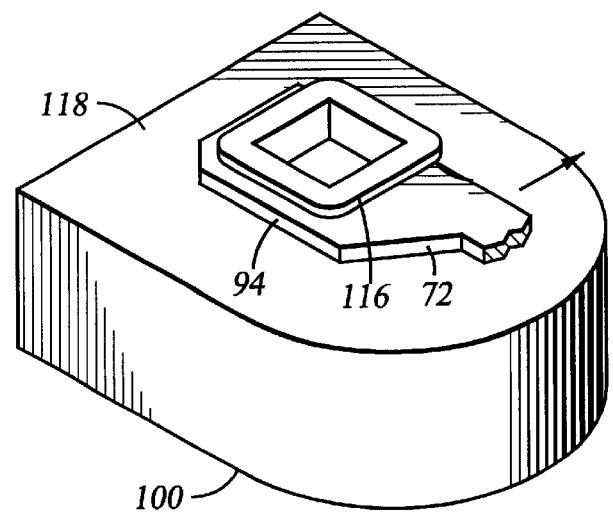

Referring to FIG. 7A, in order to transport cassette 100, end effector 72 is vertically positioned between flange 116 and top surface 118 of cassette 100. Referring to FIG. 7B, the end effector is moved laterally so that a base 117 of flange 116 fits into gap 92. Finally, referring to FIG. 7C, end effector 72 is moved vertically upwards so that an inner rim 94 of the end effector contacts an underside 119 of flange 116 to lift the cassette. The end effector may then be moved laterally to carry cassette 100 to another support shelf or platform.

Figure 8A:
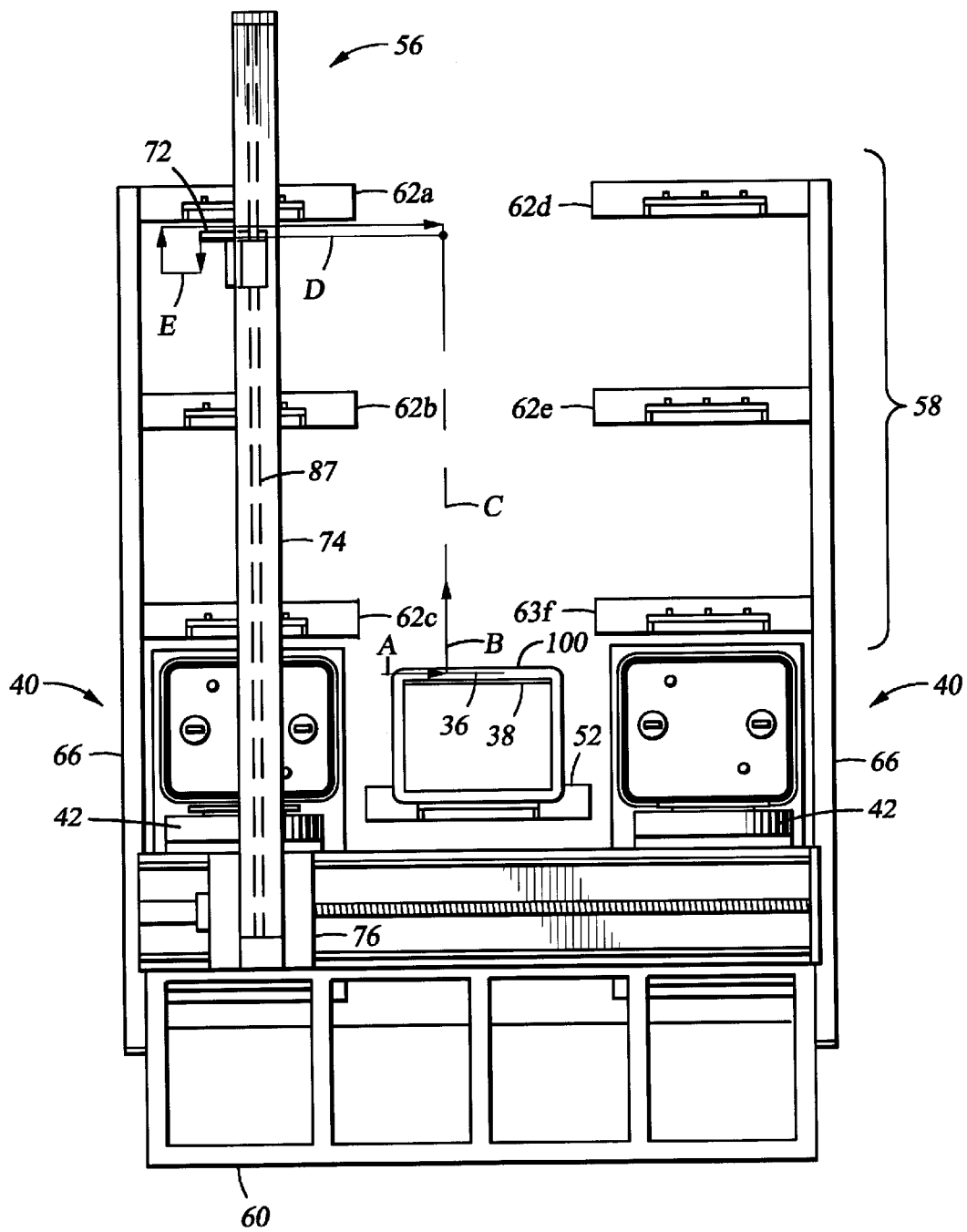
FIGS. 8A and 8B are schematic front views of the cassette stocker illustrating the path the end effector takes in moving a cassette between a loading platform and a cassette docking platform.

Referring to FIG. 8A, a cassette may be transported from loading platform 52 to a support shelf, such as support shelf 62b. With support strut 74 positioned to the side of loading platform 52, a cassette 100 is loaded onto the loading platform, either manually or by an AGV. To lift the cassette off loading platform 52, end effector 72 is positioned to the left of the cassette at a vertical height between upper surface 118 of the cassette and the lower surface of flange 116. The support strut 74 moves rightwardly until end effector 72 engages the support flange (phantom line A). Then, the end effector moves upwardly to raise the cassette off of the loading platform (phantom line B). To move the cassette to one of the support shelves, e.g., support shelf 62b, end effector 72 raises the cassette until it is generally aligned above the support shelf 62c, with sufficient vertical clearance to permit the underside of the cassette to move horizontally over support pins 64 (phantom line C). Then support strut 74 is moved leftwardly to position the cassette over the support shelf, and the end effector moves downwardly until the cassette rests on support pins 64 (phantom line D). The end effector may be withdrawn by moving it leftwardly until it clears the flange, and then moving it upwardly and rightwardly between the top of the flange and the bottom of support shelf 62b (phantom line E).

Figure 8B:
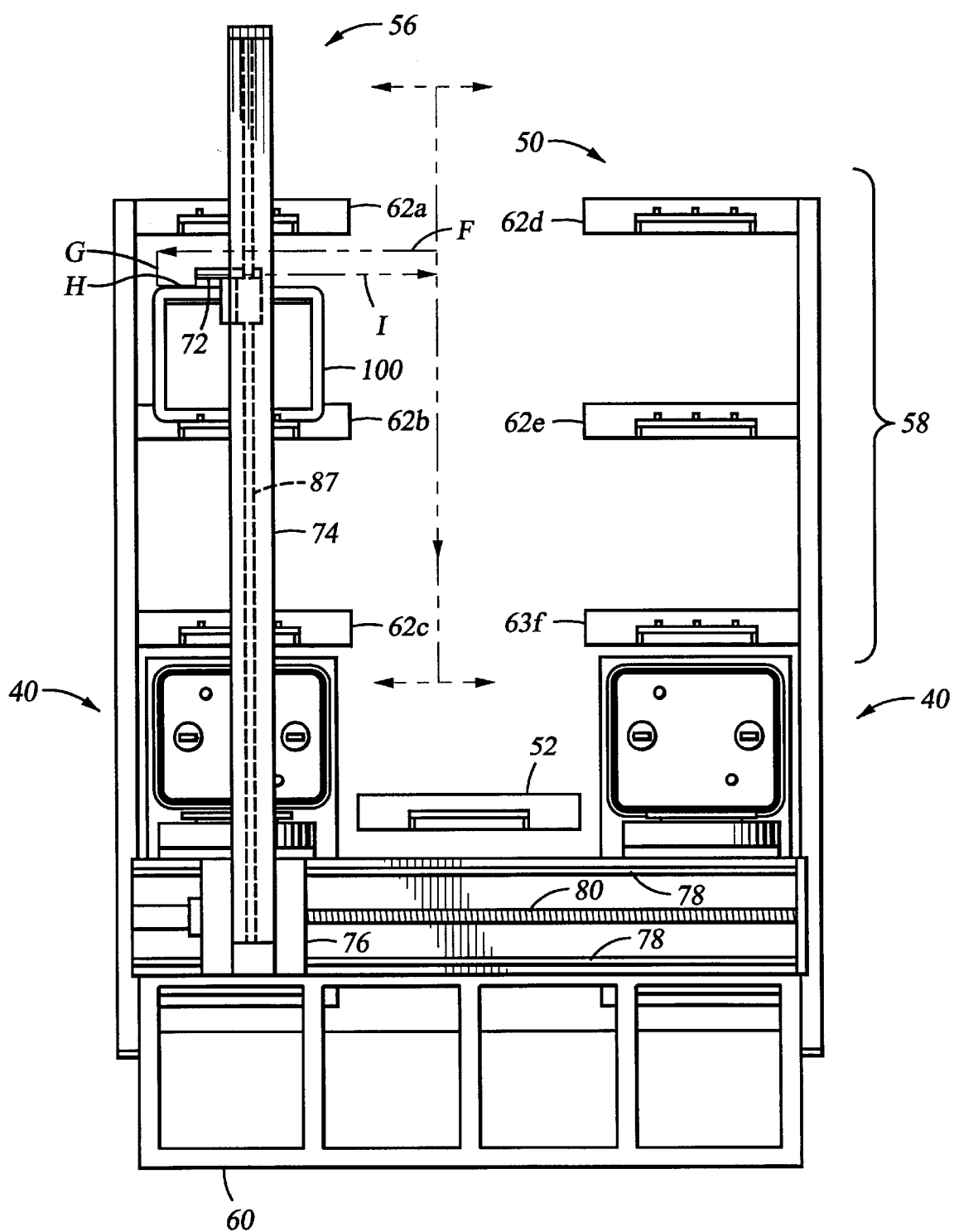

Referring to FIG. 8B, in order to remove the cassette from support shelf 62b, these steps are generally repeated in reverse order. Specifically, end effector moves leftwardly between the top of flange 116 and the bottom of support shelf 62a (phantom line F), downwardly until it is located at a vertical position between the top surface of the cassette and the underside of the flange (phantom line G), and rightwardly until it engages the flange (phantom line H). Then the end effector moves upwardly to lift the cassette off the support plate and then rightwardly to carry the cassette into the vertical channel between the storage racks (phantom line I). From this position, the cassette may be moved up or down and then left or right to a new storage shelf, to one of the docking platforms, or to the loading platform.

In the embodiments described in FIGS. 7A–8B, hook-shaped finger 90 of end effector 72 curves to the right so that rectangular gap 92 is open on the right. Of course, if hook-shaped finger 90 curved to the left so that rectangular gap 92 was open on the left, then the relative lateral motion of the end effector to engage and disengage the cassette would be reversed. For example, to lift the cassette from a support shelf, the end effector would be positioned on the right side of the cassette and moved to the leftwardly to engage the flange.

In operation, a cassette 100 is transported to processing station 20 and placed on loading platform 52, e.g., manually or by an AGV. The robotic cassette mover 56 transports the cassette from the loading platform to one of the docking stations, which aligns the front face of the cassette with docking station door 44, and then retracts docking station door 44 and cassette door 104 so that entry port 103 mates with opening 46 in cleanroom wall 26. A wafer handling robot 48 in front-end staging area 22 extracts the substrates from the cassette through opening 46 and inserts them into one of the load lock chambers 34. A robot 39 in transfer chamber 36 moves substrates between the load lock and the processing chambers. When the fabrication steps are completed, wafer handling robot 48 extracts the substrate from one of the lock load chambers, and returns it to cassette 100 through opening 46. Once all of the substrates have been processed, cassette door 104 is closed, the cassette is moved to storage rack 58 or loading platform 52, and a new cassette containing unprocessed substrates is loaded into the docking station.

Figure 9:
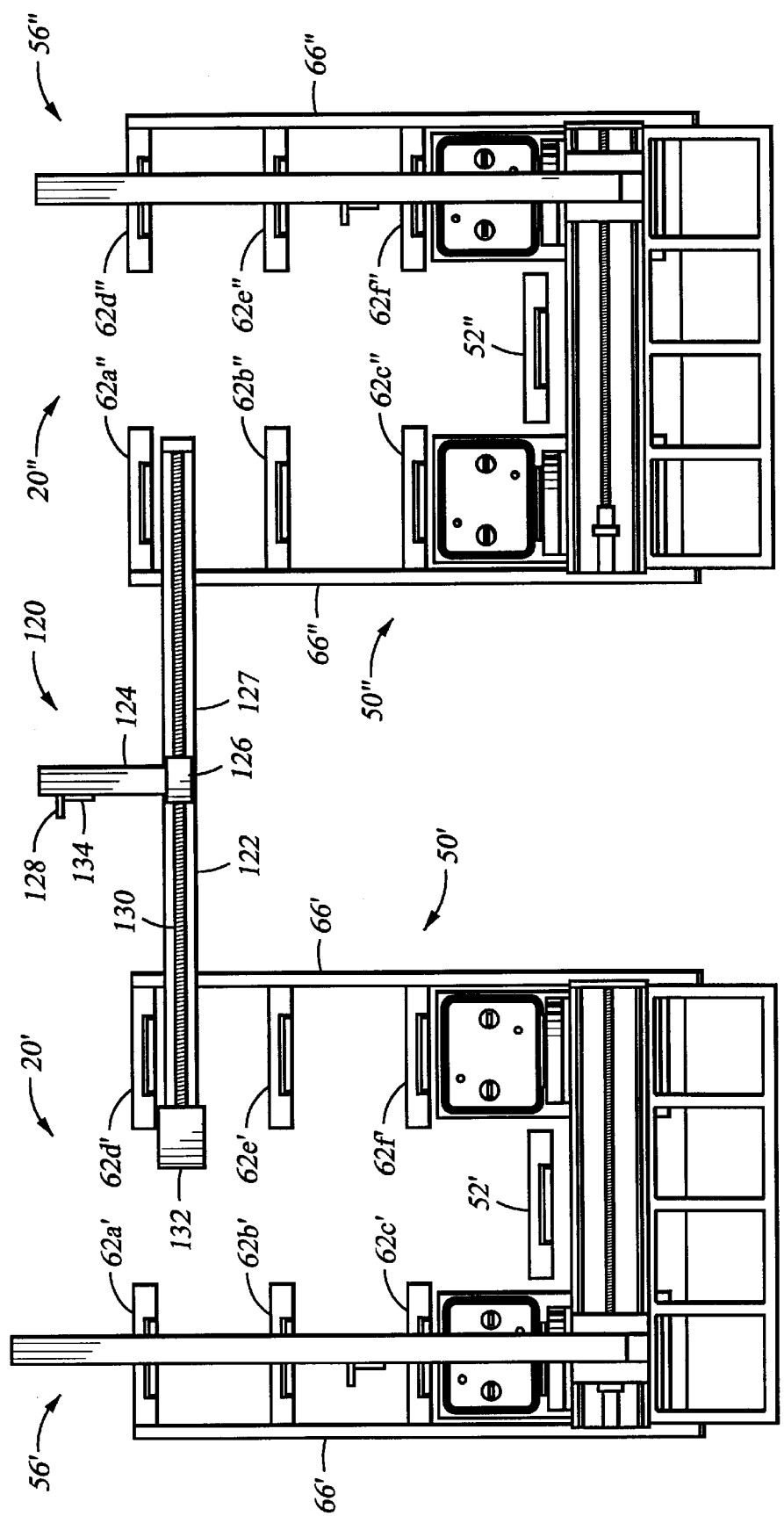
FIG. 9 is a schematic front view of two loading and storage stations connected by an interstation transfer mechanism.

Referring to FIG. 9, an interstation transfer apparatus 120 may be used to move cassettes between adjacent processing stations 20' and 20", thereby eliminating the need for AGVs or manual transport. Interstation transfer apparatus 120 includes an overhead support beam 122 which may be secured to posts 66' and 66" of adjacent cassette stockers 50' and 50". A transfer arm 124 may be attached to a slider 126 that moves horizontally along a guide 127 that is attached to or formed as part of support beam 122. The slider may be moved horizontally by a lead screw 130 which may be rotated by a horizontal drive motor 132. An end effector 128 may be connected to transfer arm 124 by a pneumatic actuator 134 to provide end effector 128 with a short vertical stroke.

In order to transport the cassettes between adjacent processing stations, the cassette is moved by robotic cassette mover 56' to the upper right-hand support shelf, i.e., support shelf 62d', of cassette stocker 50'. End effector 128 moves horizontally over flange 116, then down to a vertical position between the bottom of the flange and the top of the cassette. Then the end effector moves to the right until it engages the cassette flange. End effector 128 lifts the cassette off support plate 62e', and horizontal drive motor 132 drives the transfer arm rightwardly until the cassette is located over the upper left-hand support shelf 62a" of cassette stocker 50". Finally, the end effector lowers the cassette onto support shelf 62a" and withdraws.

Interstation transfer apparatus 120 provides an extremely simple method of transferring cassettes between adjacent processing stations. This may be particularly useful where one of the processing stations is a metrology station (which could be located entirely inside the cleanroom), since it permits the metrology measurements to be made without building a metrology apparatus into the processing equipment and without using a factory automation system.

Although cassette stockers 50' and 50" are illustrated as positioned against the same cleanroom wall, the interstation transfer apparatus could include rotary mechanisms to allow handoff between end effectors on different support beams. This would permit processing stations 20' and 20" to be positioned around the corners or at opposite walls of the cleanroom.

Figure 10:
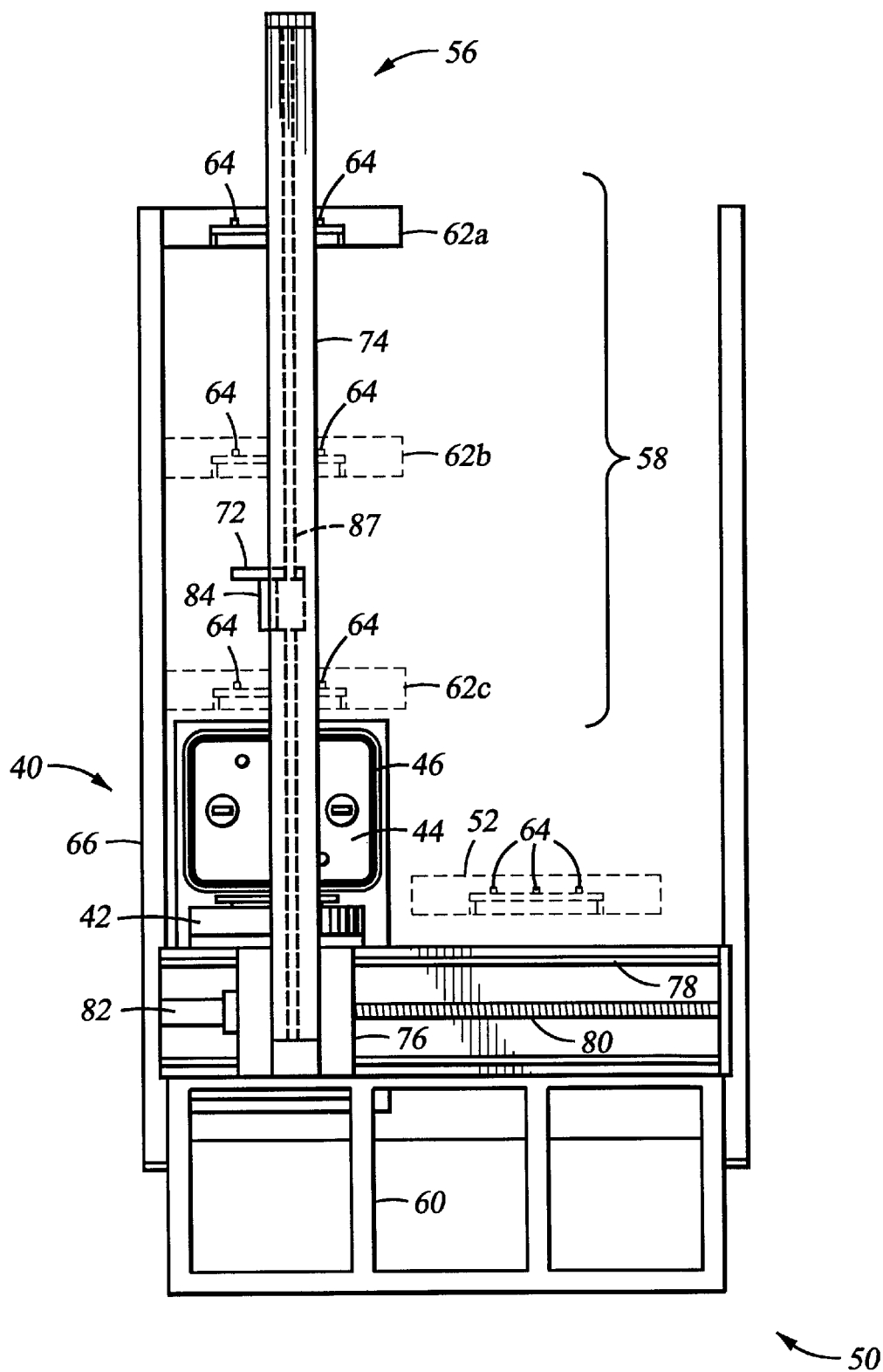
FIG. 10 is a schematic perspective view of another embodiment of a cassette stocker according to the present invention.

The embodiments described above include two storage racks 58 disposed above two docking stations 42 and a loading station 52 disposed between the two docking stations. Preferably, six cassette support shelves 62(a)–(f) are disposed above the two docking stations. While this configuration is believed to provide the highest throughput of substrates in the available space, the invention also includes a single docking station with one or more cassette support shelves disposed in proximity to the docking station. FIG. 10 is a perspective view of one embodiment of the invention having a single docking station 42 and three storage shelves 62(a)–(c) disposed above the docking station. Support shelves 62(b)–(c) are shown in phantom to indicate that only one support shelf 62(a) could be used to advantage. Components which from a part of the earlier described embodiments are identified using the same numbers.

Substrates may be loaded into the system at either the docking station position, at any one of the storage shelf positions or at a loading station 52. The loading station 52 could be disposed adjacent either a support shelf or the docking station. The substrate mover system described above in reference to the other embodiments is utilized with the single stack embodiment and operates in the same manner except that support shelves disposed in a single stack eliminate the transfer sequence from the additional stack.

Each of the embodiments described herein utilize available space above docking stations, thereby increasing the storage capability of the system without increasing the footprint (area occupied by the system measured in terms of floor space) of the system. Accordingly, a processing system could utilize any configuration of the storage device of the present invention including cassette support shelves disposed adjacent a docking station. Preferably, a cassette mover is also disposed in proximity to the support shelves and the docking station to effect transfer of cassettes between the support shelves and the docking stations.

The present invention has been described in terms of a number of embodiments. The invention, however, is not limited to the embodiments depicted and described. Rather, the invention is defined by the claims.

What is claimed is:

1. A fabrication system, comprising:
    a first processing station to perform a first fabrication step on a substrate, the first processing station including a first docking station, a first frame, a first plurality of cassette storage shelves fixedly mounted on the first frame and positioned above the first docking station, and a first cassette mover mounted on the first frame to carry a cassette between the first plurality of shelves and the first docking station;
    a second processing station to perform a second fabrication step on the substrate, the second processing station including a second docking station, a second frame, a second plurality of cassette storage shelves fixedly mounted on the second frame and positioned above the second docking station, and a second cassette mover mounted on the second frame to carry a cassette between the second plurality of shelves and the second docking station; and
    an interstation cassette mover to transport a cassette between one of the first plurality of shelves and one of the second plurality of shelves.

2. The fabrication system of claim 1, wherein the first processing system performs a first fabrication step.

3. The fabrication system of claim 2, wherein the second processing system is a metrology system.

4. The fabrication system of claim 1, wherein the shelves are arranged in columns above the docking stations, and the interstation cassette mover transports a cassette between a topmost shelf of each of the first and second plurality of shelves.

5. The fabrication system of claim 1, wherein the interstation cassette mover includes a support member positioned in front of the shelves and movable in a path parallel to a cleanroom wall, and an end effector configured to engage the cassette, the end effector vertically movable relative to the support member.

6. The fabrication system of claim 5, further comprising a supporting part mounted between the first frame and the second frame, the support member being movably mounted on the supporting part.

7. An apparatus for storing cassettes, comprising:
    one or more docking stations positionable adjacent a cleanroom wall and each including a respective door adapted to seal an opening in the cleanroom wall;
    a frame positioned adjacent the cleanroom wall;
    one or more cassette storage shelves fixedly mounted on the frame and adjacent the one or more docking stations;
    a horizontally-extending guide mounted on the frame; and
    a cassette mover including a slider mounted for movement along the guide.

8. The apparatus of claim 7 wherein the one or more cassette storage shelves are disposed above the one or more docking stations.

9. The apparatus of claim 8 further comprising a loading station disposed adjacent the one or more docking stations.

10. The apparatus of claim 7, wherein each docking station includes a docking platform to support a cassette, and the frame is at least partially disposed below the docking platform.

* * * * *